(12) United States Patent
Yamamoto et al.

(10) Patent No.: US 11,415,599 B2
(45) Date of Patent: Aug. 16, 2022

(54) CONTACT PROBE AND ELECTRICAL CONNECTION JIG

(71) Applicant: NIDEC READ CORPORATION, Kyoto (JP)

(72) Inventors: Masami Yamamoto, Kyoto (JP); Norihiro Ota, Kyoto (JP); Shigeki Sakai, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 223 days.

(21) Appl. No.: 16/466,656

(22) PCT Filed: Oct. 4, 2017

(86) PCT No.: PCT/JP2017/036142
§ 371 (c)(1),
(2) Date: Jun. 5, 2019

(87) PCT Pub. No.: WO2018/110044
PCT Pub. Date: Jun. 21, 2018

(65) Prior Publication Data
US 2019/0383858 A1      Dec. 19, 2019

(30) Foreign Application Priority Data

Dec. 16, 2016   (JP) ............................. JP2016-244683

(51) Int. Cl.
*G01R 1/067*    (2006.01)
*G01R 31/00*    (2006.01)
(Continued)

(52) U.S. Cl.
CPC ...... *G01R 1/06722* (2013.01); *G01R 1/06733* (2013.01); *G01R 1/06755* (2013.01); *G01R 3/00* (2013.01); *G01R 31/2886* (2013.01)

(58) Field of Classification Search
CPC .. G01R 1/06722; G01R 3/00; G01R 1/06738; G01R 1/06733; G01R 1/06716;
(Continued)

(56) References Cited

U.S. PATENT DOCUMENTS 7,679,389 B2    3/2010   Kuniyoshi et al.
7,960,988 B2    6/2011   Fukami et al.
(Continued)

FOREIGN PATENT DOCUMENTS

JP    H04237809 A    8/1992
JP    2003142189 A   5/2003
(Continued)

OTHER PUBLICATIONS

Office Action received for U.S. Appl. No. 15/989,271 dated Nov. 5, 2019, 11 pages.
(Continued)

*Primary Examiner* — Raul J Rios Russo
(74) *Attorney, Agent, or Firm* — Viering, Jentschura & Partner MBB

(57) ABSTRACT

A contact probe may include a Ni pipe that may include a coiled spring structure, and the Ni pipe 11 may contain 0.5 to 10 wt % of phosphorus (P). The contact probe may have improved durability, by reducing shrinkage, after probing performed in a high temperature environment.

20 Claims, 5 Drawing Sheets

(51) Int. Cl.
*G01R 3/00* (2006.01)
*G01R 31/28* (2006.01)

(58) Field of Classification Search
CPC ............ G01R 1/06772; G01R 1/06755; G01R 31/2886; H01L 2924/00; H01L 2924/0002
USPC ......... 324/71, 378, 403, 415, 425, 500, 537, 324/755.01, 755.04, 755.05
See application file for complete search history.

(56) References Cited

U.S. PATENT DOCUMENTS

| | | | |
|---|---|---|---|
| 8,671,567 B2 | 3/2014 | Hirakawa et al. | |
| 9,015,935 B2 | 4/2015 | Takeya | |
| 9,109,294 B2 | 8/2015 | Kojima et al. | |
| 10,024,908 B2 | 7/2018 | Ando et al. | |
| 10,775,416 B2 | 9/2020 | König et al. | |
| 2004/0238074 A1* | 12/2004 | Yoshikawa | C22C 38/46 148/333 |
| 2004/0259406 A1 | 12/2004 | Yoshida et al. | |
| 2007/0267112 A1* | 11/2007 | Yoshikawa | C22C 38/34 148/580 |
| 2011/0278172 A1* | 11/2011 | Cotte | C25D 7/123 205/91 |
| 2012/0021170 A1 | 1/2012 | Hantschel et al. | |
| 2013/0230933 A1* | 9/2013 | Li | H01L 31/0272 438/14 |
| 2014/0028343 A1 | 1/2014 | Numata et al. | |
| 2017/0167004 A1* | 6/2017 | Park | C22C 38/02 |
| 2017/0307657 A1 | 10/2017 | Crippa | |
| 2018/0163287 A1* | 6/2018 | Park | C22C 38/02 |
| 2018/0313471 A1* | 11/2018 | Debeaux | C22C 38/18 |
| 2019/0383858 A1 | 12/2019 | Yamamoto et al. | |
| 2020/0124637 A1* | 4/2020 | Chung | G01R 1/06722 |

FOREIGN PATENT DOCUMENTS

| | | | |
|---|---|---|---|
| JP | 2005332830 | A | 12/2005 |
| JP | 2006228743 | A | 8/2006 |
| JP | 2008066076 | A | 3/2008 |
| JP | 2009094080 | A | 4/2009 |
| JP | 2010174322 | A | 8/2010 |
| JP | 2010281607 | A | 12/2010 |
| JP | 2012225865 | A | 11/2012 |
| JP | 2014028343 | A | 2/2014 |
| JP | 2016151060 | A | 8/2016 |
| JP | 2016166899 | A | 9/2016 |
| JP | 6221031 | B1 | 11/2017 |
| WO | 2008155864 | A1 | 12/2008 |
| WO | 2016155937 | A1 | 10/2016 |

OTHER PUBLICATIONS

Notice of Allowance received for U.S. Appl. No. 15/989,271 dated Mar. 5, 2020, 8 pages.
Yamamoto et al., "Contact Probe", U.S. Appl. No. 15/989,271, filed May 25, 2018.
Pillai et al, Electrodeposited nickel-phosphorous (Ni—P) alloy coating: an in-depth study of its preparation, properties, and structural transitions, Journal of Coatings Technology and Research, Apr. 19, 2012, pp. 785-797, vol. 9, No. 6, XP055710084, ISSN: 1547-0091, DOI: 10.1007/s11998-012-9411-0.
Yang Jie et al., Preparation of Two-dimensional Gradient Ni—P Alloy Coating by Electro-plating on Copper Surface, Hot Working Technology 2011, 3p.p., VO1.40, No. 12.

* cited by examiner

CONTACT PROBE AND ELECTRICAL CONNECTION JIG

CROSS-REFERENCE TO RELATED APPLICATIONS

This application is a national stage entry according to 35 U.S.C. 371 of PCT Application No. PCT/JP2017/036142 filed on Oct. 4, 2017, which claims priority to Japanese Application No. 2016-244683 filed on Dec. 16, 2016, which are entirely incorporated herein by reference.

TECHNICAL FIELD

The present disclosure relates to a contact probe and an electrical connection jig.

BACKGROUND

A continuity test has been performed in various technical fields. For example, the continuity test is performed on a semiconductor integrated circuit, an electronic device board or a circuit wiring board of a flat panel display, and the like. This test is performed by using an inspection apparatus including a large number of contact probes and bringing the contact probes into contact with electrodes of a specimen. As the specimens become smaller, higher in density, and higher in performance, there is a need for fine contact probes.

JP 4572303 B2 discusses a method for producing a contact probe for use in a continuity testing jig. In this producing method, after a gold-plated layer may be formed on an outer periphery of a core through plating, a Ni electroformed layer may be formed on an outer periphery of the gold-plated layer through electroforming. A spring structure may be formed at a part of the Ni electroformed layer through photolithography. Thereafter, the core may be removed while leaving the gold-plated layer on an inner periphery of the Ni electroformed layer. According to this producing method, it may be possible to manufacture an ultra-slim and thin contact probe for use in a continuity testing jig, the contact probe having an electroformed spring structure, with increased accuracy and precision.

SUMMARY

A continuity test is performed in a high temperature environment of 120° C. or more in some cases. A problem resulting from this is that a total length of a spring of a spring structure in a contract probe may shrink to an unacceptable extent, when probing is performed in a high temperature environment. When a portion (i.e., spring portion) including the spring structure is used in the high temperature environment and the spring portion is released from the shrunk state, the spring does not return to the original spring shape, and the spring length becomes shortened.

An object of the present disclosure is to provide a contact probe with improved durability, by reducing shrinkage, after probing is performed, even when the probing is performed in a high temperature environment.

A contact probe according to a non-limiting aspect of the present disclosure may include a Ni pipe including a coiled spring structure. The Ni pipe may contain 0.5 to 10 wt % of phosphorus (P).

In the contact probe according to a non-limiting aspect of the present disclosure, a content of the P in the Ni pipe may be 1 to 5 wt %.

In the contact probe according to a non-limiting aspect of the present disclosure, a content of the P in the Ni pipe may be 2 to 4 wt %.

The contact probe according to a non-limiting aspect of the present disclosure may further include a plunger connected to the Ni pipe.

An electrical connection jig according to another non-limiting aspect of the present disclosure may include any one of the contact probes described above.

DETAILED DESCRIPTION

Figure 1:
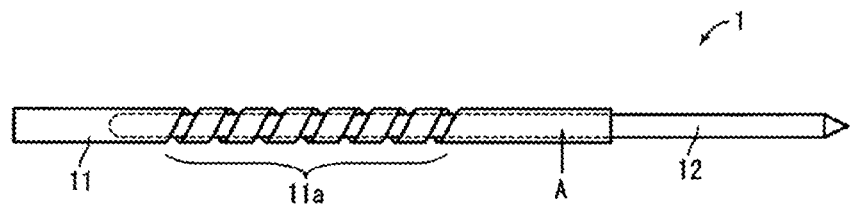
FIG. 1 is a side view of a contact probe according to a non-limiting embodiment of the present disclosure.

The present inventors have examined a method of reducing shrinkage after probing is repeated in a high temperature environment in a contact probe including a Ni pipe including a coiled spring structure. As a result, the present inventors have found that a Ni pipe containing 0.5 to 10 wt % of phosphorus (P) can reduce the shrinkage.

The present disclosure has been completed based on the aforementioned findings. Hereinafter, a non-limiting embodiment of the present disclosure will be described in detail with reference to the drawings. In the drawings, the same or equivalent portions will be assigned the same reference signs, and the description thereof will not be repeated. Dimensional ratios between components illustrated in the drawings do not necessarily indicate actual dimensional ratios.

[Structure of Contact Probe]

FIG. 1 is a side view of a contact probe 1 according to a non-limiting embodiment of the present disclosure. The contact probe 1 includes a Ni pipe 11, and a plunger 12.

Figure 9:
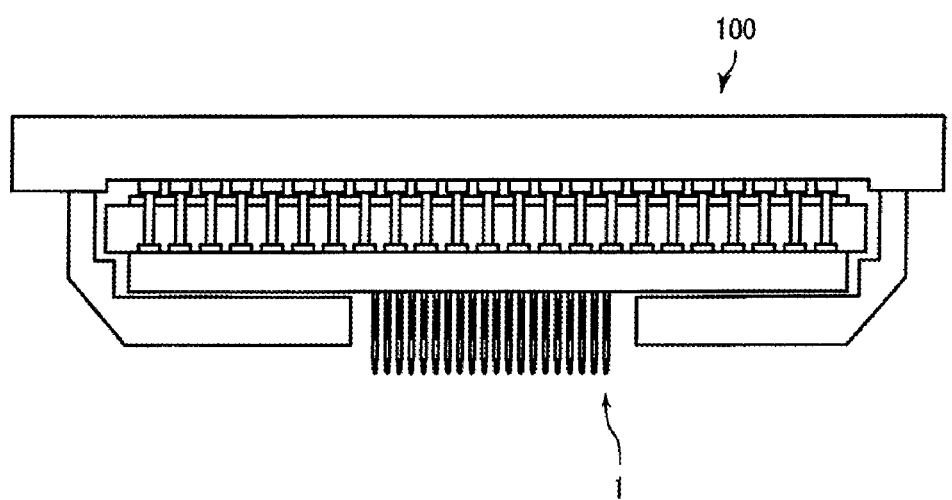
FIG. 9 is a diagram illustrating an example of an electrical connection jig including the contact probe.

The contact probe 1 can be suitably used as a contact probe of an electrical connection jig that electrically connects an inspection point set on an inspection object and an inspection apparatus that inspects the inspection object to each other. For example, the electrical connection jig can exemplify an IC socket that accommodates an IC or an LSI such that the IC and LSI are replaceable and performs an electrical inspection, a board inspection jig that electrically connects a board and a board inspection apparatus to each other, or a probe card that electrically connects a semiconductor wafer and a semiconductor inspection apparatus to each other. FIG. 9 illustrates an example structure of a probe card 100 as an example of the electrical connection jig including the contact probe 1. The probe card is a jig for use in the electrical inspection of an LSI chip formed on a silicon wafer in a wafer inspection process of producing the LSI. The probe card is attached to a wafer prober (not illustrated), and functions as a connector that connects an electrode of the LSI chip and an LSI tester, which is a measurement device, to each other. The determination of whether a product is good or bad is performed by bringing the contact probe 1 into contact with the electrode of the LSI chip and performing the electrical inspection. FIG. 9 is merely an example, and the electrical connection jig including the contact probe 1 is not limited to this example.

The Ni pipe 11 has, for example, a substantially cylindrical shape, and has a coiled spring structure 11a formed at at least a part thereof. The present embodiment is not limited to this example, and the Ni pipe 11 may be an extremely thin pipe of which an outside diameter is 32 to 500 µm and a thickness of about 2 to 50 µm in another non-limiting embodiment.

For example, the Ni pipe 11 is formed through electroplating. The Ni pipe 11 contains 0.5 to 10 wt % of phosphorus (P). The details of the composition (content of P) of the Ni pipe 11 will be described below.

The plunger 12 is formed by using a conductor, and has, for example, a substantially columnar shape. Examples of a material of the plunger 12 include platinum, rhodium, or an alloy thereof, and a beryllium-copper alloy or tungsten plated with gold on nickel.

In the example illustrated in FIG. 1, a tip end of the plunger 12 has a tapered shape. However, the tip end of the plunger 12 may have any shape, and can have various shapes such as a semicircular shape, a flat shape, and crown shape depending on the purpose of use.

For example, the Ni pipe 11 and the plunger 12 are connected to each other at a portion represented by a reference sign A of FIG. 1 while the plunger 12 is inserted into the Ni pipe 11. For example, the connection method can be performed through crimping, welding, or bonding.

With such a structure, when a specimen is brought into contact with the tip end of the plunger 12 and is pushed in a direction of the Ni pipe 11, a portion of the coiled spring structure 11a of the Ni pipe 11 shrinks, and the tip end of the plunger 12 and the specimen are brought into contact with each other with a predetermined pressure due to a restoring force at the same portion. The contact probe 1 and the specimen can thus be brought into resilient contact with each other.

The contact probe 1 may further include a gold-containing layer on an inner periphery of the Ni pipe 11.

[Method for Producing Contact Probe 1]

As stated above, the contact probe 1 can be produced by connecting the Ni pipe 11 and the plunger 12 to each other while the plunger 12 is inserted into the Ni pipe 11. Hereinafter, an example of the method for producing the Ni pipe 11 will be described in detail with reference to FIGS. 2 and 3A to 3D. Note that the method for producing the Ni pipe 11 is not limited to this example.

Figure 2:
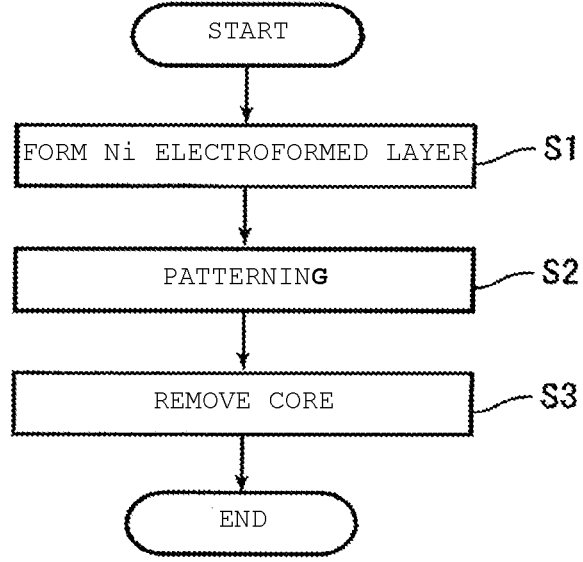
FIG. 2 is a flowchart illustrating an example of a method for producing a Ni pipe.

FIG. 2 is a flowchart illustrating the example of the method for producing the Ni pipe 11. This producing method includes a process of forming a Ni electroformed layer (step S1), a process of patterning the Ni electroformed layer (step S2), and a process of removing a core (step S3).

Figure 3A:
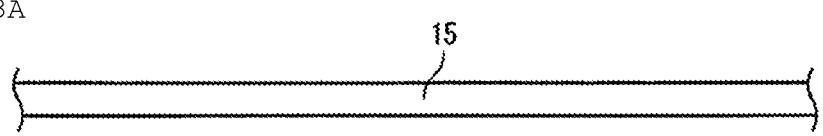
FIG. 3A is a diagram for describing the method for producing the Ni pipe.

Initially, a core 15 is prepared (see FIG. 3A). Examples of the core 15 include metal wires made of stainless steel, aluminum, and so on. A Ni electroformed layer 10 is formed on an outer periphery of the core 15 through electroplating (see FIG. 3B). A thickness of the Ni electroformed layer 10 is not particularly limited, but is, for example, 2 to 50 µm. The electroplating method is not particularly limited, but a typical method can be used.

The Ni electroformed layer 10 contains 0.5 to 10 wt % of P. To cause the Ni electroformed layer 10 to contain P, a phosphorus compound such as a phosphoric acid or a phosphorous acid may be mixed into a plating solution, for example. For example, in an example to be described below, the phosphorous acid is mixed into the plating solution. For example, the Ni electroformed layer can be produced by mixing the phosphorous acid with a quantity of 35.0 g/L or less into the plating solution.

Figure 3B:
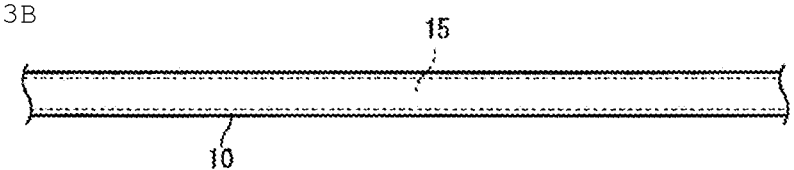
FIG. 3B is a diagram for describing the method for producing the Ni pipe.
Figure 3C:
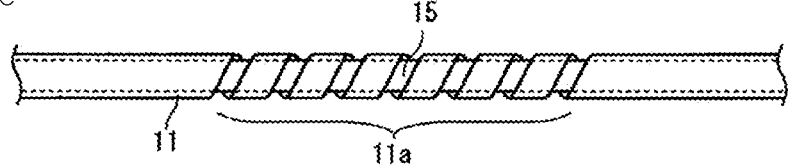
FIG. 3C is a diagram for describing the method for producing the Ni pipe.

The Ni pipe 11 including the coiled spring structure 11a is formed by patterning the Ni electroformed layer 10 (see FIG. 3C). Photolithography, for example, may be used for the patterning. Specifically, a resist layer (not illustrated) is first formed on an outer periphery of the Ni electroformed layer 10 (FIG. 3B). Then, the resist layer is exposed to laser light while the core 15 is being rotated, to define a spiral groove in the resist layer. The Ni electroformed layer 10 is subjected to etching with the resist layer remaining on the outer periphery of the Ni electroformed layer 10 used as a mask. Accordingly, the coiled spring structure 11a is formed.

Figure 3D:
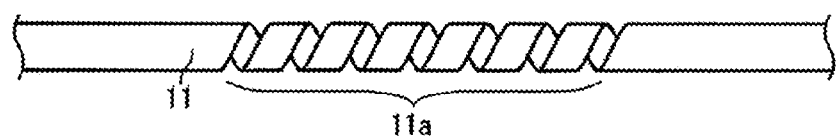
FIG. 3D is a diagram for describing the method for producing the Ni pipe.

After the coiled spring structure 11a is formed, the core 15 is removed (see FIG. 3D). For example, the removal of the core 15 can be accomplished by pulling the core 15 from one side or from both sides to deform the core 15 such that the cross-sectional area of the core 15 is reduced, and pulling out the core 15 in this condition.

Through the aforementioned processes, it is possible to produce the Ni pipe 11 which includes the coiled spring structure 11a and contains 0.5 to 10 wt % of P.

A thin gold-containing layer (not illustrated) may be formed on the outer periphery of the core 15 through plating before the Ni electroformed layer 10 is formed in a non-limiting embodiment of the present disclosure. A thickness of the gold-containing layer is, for example, 0.2 to 1 µm. That is, it is the gold-containing layer may be formed on the outer periphery of the core 15 in a non-limiting embodiment of the present disclosure, and then, the Ni electroformed layer 10 may be formed on an outer periphery of the gold-containing layer. The formation of the gold-containing layer will contribute to preventing an etchant from reaching an inner periphery of the Ni electroformed layer 10 during the patterning (step S2). When the core 15 is made of stainless steel, it is possible to easily pull out the core 15 while leaving the gold-containing layer on an inner surface of the Ni electroformed layer 10 during the removal of the core (step S3) by using the fact that adhesion of the stainless steel to the gold-containing layer is bad.

In the case where the gold-containing layer is formed on the outer periphery of the core 15, a synthetic resin wire made of, for example, nylon or polyethylene may be used as the core 15. In this case, the gold-containing layer may be formed by electroless plating. In addition, the removal of the core 15 (step S3) can be accomplished by immersing the core 15 in a strong alkaline solution or the like.

An example of the method for producing the Ni pipe 11 has been described above. In this example, it has been described that the Ni pipe 11 is produced through electroforming. However, the Ni pipe 11 may be produced by a method other than electroforming.

[Composition of Ni Pipe 11]

The Ni pipe 11 contains 0.5 to 10 wt % of phosphorus (P). 0.5 to 10 wt % of P is contained in the Ni pipe, and thus, it is possible to suppress the shrinkage of the contact probe 1 after probing in a high temperature environment.

The content of P in the Ni pipe 11 can be adjusted by appropriately increasing or decreasing the quantity of phosphorus compounds (for example, phosphorous acid) to be mixed into the plating solution.

The content of P in the Ni pipe 11 can be measured by performing energy-dispersive X-ray spectroscopy (EDX) on a surface of the Ni pipe 11. In this measuring method, a plurality of specific points are set on the Ni pipe 11, and the average of values measured at the plurality of specific points is calculated. The specific points may be set in any desired manner. For example, the specific points may be set at regular intervals along the length of the Ni pipe 11. As illustrated in FIG. 1, one or more points can be set from the coiled spring structure 11a and two cylindrical portions formed with the coiled spring structure 11a interposed therebetween. Specifically, the P content in the Ni pipe is measured by performing the EDX on the surface while the Ni layer is exposed. Before the measurement, the surface of the object is washed with ethanol. An apparatus that has a scanning electron microscope (SEM) and EDX integrated therein, for example, may be used for the measurement. An electron beam of 25 kV and 80 µA may be used. The content of P is measured at five points along the length of the Ni pipe (i.e., along a pipe axial direction), and the average thereof is calculated.

The content of P in the Ni pipe 11 may be 0.5 to 7 wt % in a non-limiting embodiment of the present disclosure or 1 to 5 wt % in another non-limiting embodiment of the present disclosure. The content of P falls within this range, and thus, it is possible to further reduce shrinkage. The content of P in the Ni pipe 11 may be 2 to 4 wt % in yet another non-limiting embodiment of the present disclosure.

As will be described below, a contact probe in which the Ni pipe 11 does not substantially contain P is difficult to be used in an environment of 125° C. or more. In contrast, when the content of P in the Ni pipe 11 is 0.5 to 10 wt %, it is possible to obtain a contact probe capable of being used even in an environment in which a temperature is up to 125° C. When the content of P in the Ni pipe 11 is 0.5 to 7 wt %, it is possible to obtain a contact probe capable of being used even in an environment in which a temperature is up to 140° C. When the content of P in the Ni pipe 11 is 1 to 5 wt %, it is possible to obtain a contact probe capable of being used even in an environment in which a temperature is up to 150° C. When the content of P in the Ni pipe 11 is 2 to 4 wt %, it is possible to obtain a contact probe capable of being used even in an environment in which a temperature is up to 220° C. The relationship between the contents of P in the Ni pipe 11 and the temperatures at which the contact probe is available will be described in detail in the Example section.

It may be preferable that the amount of impurities mixed in the producing process is small. Note that additional elements may be added.

The structure and producing method of the contact probe 1 according to the non-limiting embodiment of the present disclosure and the composition of the Ni pipe 11 have been described above. With the structure of the contact probe 1 having the composition of the Ni pipe 11, it is possible to reduce shrinkage in a high temperature environment.

[Modification Example of Contact Probe 1]

Figure 4:
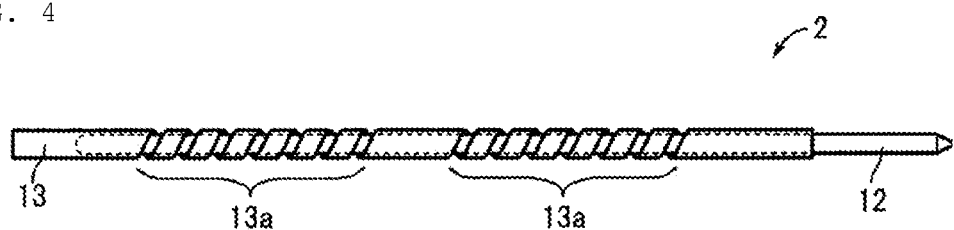
FIG. 4 is a side view of a contact probe according to a modification example.

FIG. 4 is a side view of a contact probe 2 according to Modification Example of the contact probe 1. The contact probe 2 includes a Ni pipe 13 instead of the Ni pipe 11 of the contact probe 1 (FIG. 1). Similarly to the Ni pipe 11, the Ni pipe 13 also contains 0.5 to 10 wt % of P. The Ni pipe 13 is different from the Ni pipe 11 in that two coiled spring structures 13a are formed. The number of coiled spring structures 13a may be three.

The same advantageous effects as those of the contact probe 1 are obtained by the contact probe 2. As stated above, the number or positions of coiled spring structures of the Ni pipe are optional. The overall Ni pipe may have the coiled spring structure.

EXAMPLES

Hereinafter, the various non-limiting aspects of the present disclosure will be described in detail by way of examples. The present disclosure is not limited to these examples.

A Ni pipe which includes a coiled spring structure and of which an outside diameter is 70 µm, an inside diameter is 54 µm, and a total length is 3850 µm was produced by the method described in "Method for Producing Contact Probe 1. More specifically, a gold-plated layer was formed as a gold-containing layer on an outer periphery of a core made of stainless steel. A thickness of the gold-containing layer was 0.2 µm. Subsequently, a Ni electroformed layer was formed on an outer periphery of the gold-containing layer through electroplating. After the Ni electroformed layer is patterned through photolithography, the Ni pipe was obtained by pulling out the core while leaving the gold-containing layer on an inner surface of the Ni electroformed layer. A portion of a coiled spring structure was formed in the center of the Ni pipe in a longitudinal direction. Both end portions of the Ni pipe had a cylindrical shape. A length of the coiled spring structure was 2136 µm, the maximum stroke amount in design was 330 µm, the number of windings of the spring was 24, a band width of the spring was 54 µm, and a thickness of the spring was 8 µm.

Ni pipes having different contents of P were produced while changing the quantity of phosphorus compounds to be mixed into a plating solution. Specifically, Ni pipes of which contents of P are 1.5 wt %, 2 wt %, 3 wt %, and 8 wt % were produced by appropriately adjusting the quantity of phosphorous acid mixed into the plating solution (nickel sulfamate bath). As a Comparative Example, a Ni pipe which is substantially pure Ni having a content of P less than a detection limit (hereinafter, referred to as "0 wt %) was produced by using a plating solution without containing phosphorous acid. An apparatus that has an SEM (SU-1500 manufactured by Hitachi High-Technologies Corporation) and EDX (APEX2A10+60 manufactured by AMETEK, Inc.) integrated therein was used for the measurement of the content of P in the Ni pipe. The content of P in the Ni pipe according to the Comparative Example was 0 wt % (less than a detection limit using the EDX).

A plunger of which an outside diameter is 48 µm and a total length is 5800 µm was inserted into the Ni pipe. One end portion of the plunger had a substantially conical shape. Subsequently, contact probes were produced by connecting one cylindrical portion of the Ni pipe close to the conical-shaped end portion of the plunger and the plunger to each other through electric resistance welding. Spring constants of all the produced contact probes were about 0.125 N/mm.

Durability for the produced contact probes in the high temperature environment was evaluated as follows.

Figure 5:
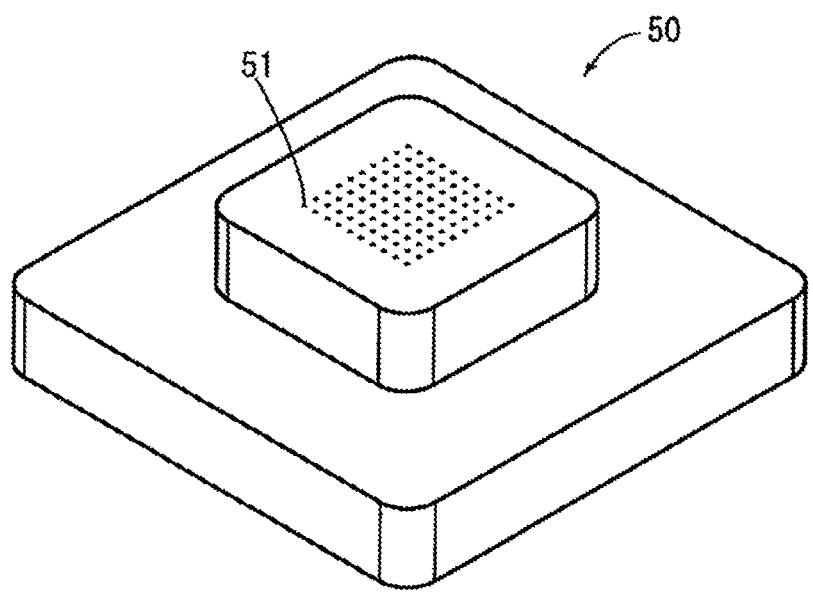
FIG. 5 is a perspective view of a jig (housing) for use in a durability evaluation test in a high temperature environment.
Figure 6:
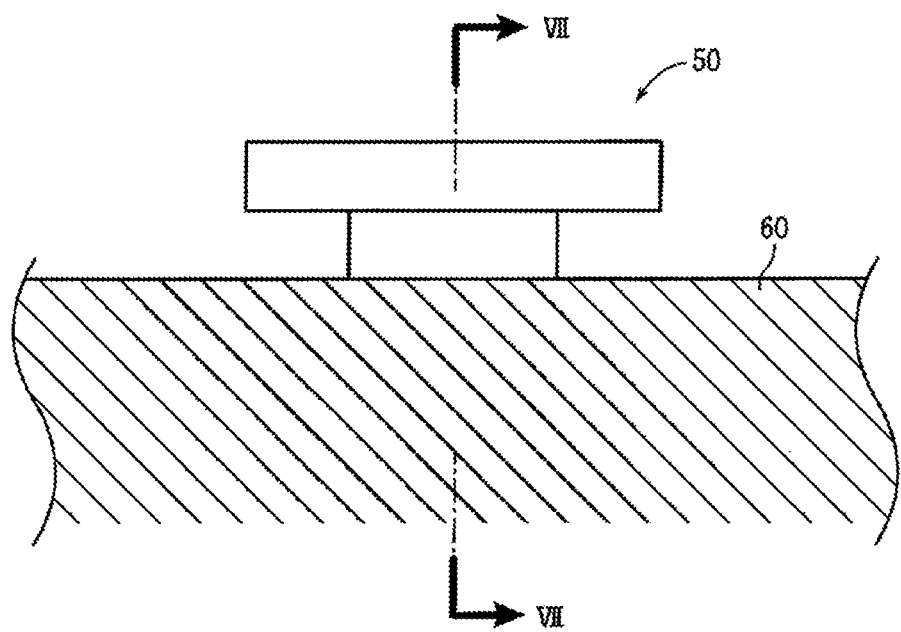
FIG. 6 is a schematic diagram illustrating a state during the test.
Figure 7A:
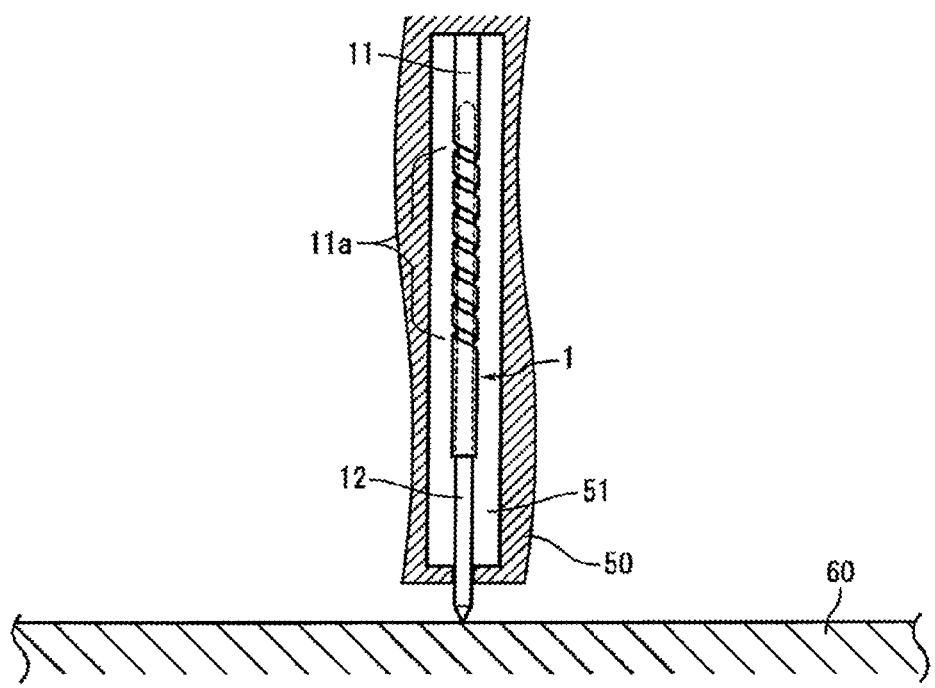
FIG. 7A is a cross-sectional view taken along line VII-VII of FIG. 6.
Figure 7B:
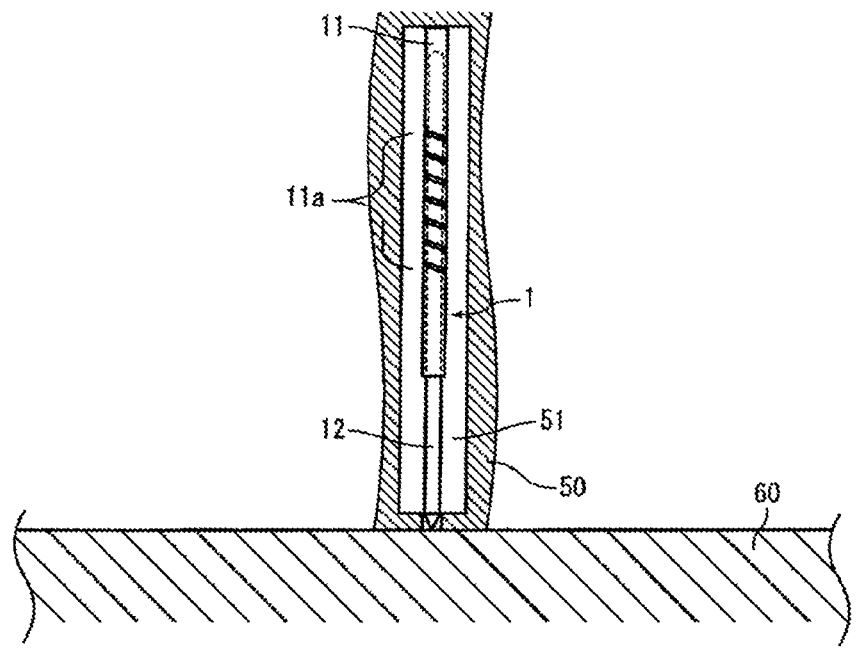
FIG. 7B is a cross-sectional view taken along line VII-VII of FIG. 6.

FIG. 5 is a perspective view of a jig (housing) 50 for use in a durability evaluation test in the high temperature environment. FIG. 6 is a schematic diagram illustrating a state during the test. FIGS. 7A and 7B are cross-sectional views taken along line VII-VII of FIG. 6.

Referring to FIG. 5, the housing 50 is made of a metal, and is in the shape of a box. A plurality of holes 51, each of which is arranged to accommodate the contact probe 1 therein, are defined at one surface of the housing 50. Referring to FIG. 7A, the contact probe 1 is accommodated in the corresponding hole 51 with the plunger 12 thereof arranged on the opening side. At this time, a tip of the plunger 12 protrudes from the hole 51.

The housing 50 is mounted on a hot plate 60 with an opening portion of each hole 51 facing downward and the hot plate 60 set at a predetermined evaluation temperature. The length of a portion of the plunger 12 which protrudes from the hole 51 is set so that the Ni pipe 11 will be compressed by a distance substantially equal to a maximum stroke (i.e., 330 μm) thereof. Thus, when a weight (not illustrated) having a predetermined weight is placed on the housing 50, for example, the contact probe 1 can be maintained in the state of being compressed by the distance substantially equal to the maximum stroke as illustrated in FIG. 7B.

The contact probe 1 is maintained in this state for 20 hours. Thereafter, the contact probe 1 is removed from the hole 51 in an ordinary temperature environment, and an overall length of the contact probe 1 is measured with the contact probe 1 oriented horizontally and no load applied to the contact probe 1. A difference between the measured overall length and an overall length of the contact probe before being maintained in the aforementioned state for the aforementioned time is defined as a "shrinkage" for the evaluation temperature. Lower values of the shrinkage mean greater durability in a high temperature environment.

The shrinkage for each evaluation temperature was measured with respect to thirty contact probes, and the average thereof was determined as the shrinkage for the evaluation temperature. The present evaluation test was performed in order to obtain a shrinkage of 50 μm or less (0.05 mm or less). When the shrinkage exceeds 50 μm, a contact load of the contact probe with an electrode of a specimen of a continuity test decreases, and electrical contact becomes unstable. Thus, when the shrinkage is 50 μm or less, it was determined that the contact probe is available in the evaluation temperature.

Figure 8:
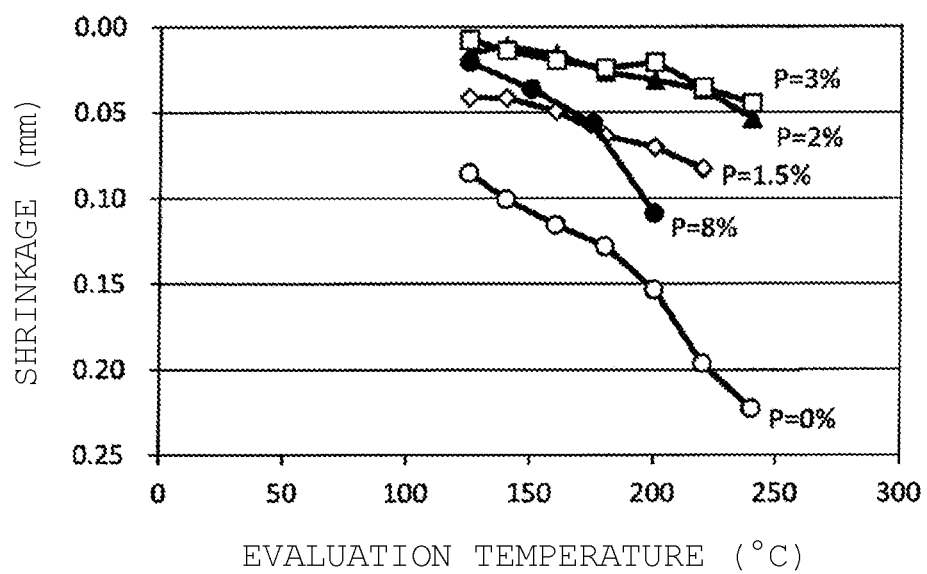
FIG. 8 is a graph illustrating the relationship between an evaluation temperature and shrinkage.

In Table 1, measurement values of the shrinkage at different contents of P were represented. Each blank field of Table 1 represents that the corresponding measurement is not performed. In FIG. 8, these values are plotted, and the relationship between the evaluation temperature (horizontal axis) and the shrinkage (vertical axis) was illustrated.

TABLE 1

| Evaluation temperature | Shrinkage (mm) | | | | |
|---|---|---|---|---|---|
| (° C.) | P: 0% | P: 1.5% | P: 2% | P: 3% | P: 8% |
| 125 | 0.085 | 0.041 | 0.016 | 0.008 | 0.021 |
| 140 | 0.100 | 0.042 | 0.011 | 0.014 | |
| 150 | | | | | 0.037 |
| 160 | 0.116 | 0.049 | 0.016 | 0.020 | |
| 175 | | | | | 0.056 |
| 180 | 0.128 | 0.064 | 0.027 | 0.024 | |
| 200 | 0.153 | 0.070 | 0.031 | 0.021 | 0.109 |
| 220 | 0.197 | 0.083 | 0.037 | 0.036 | |
| 240 | 0.223 | | 0.054 | 0.045 | |

As illustrated in Table 1 and FIG. 8, the contact probe in which the Ni pipe contains P had a small shrinkage at all the evaluation temperatures at which the measurement has been performed when compared to a case where the Ni pipe does not contain P (the content of P is less than the detection limit using the EDX). The shrinkage at the evaluation temperature of 125° C. could be 50 μm or less in the contact probe in which the Ni pipe contains P, whereas the shrinkage could not be 50 μm or less in the contact probe in which the Ni pipe does not contain P.

A difference in shrinkage between the contact probe in which the Ni pipe contains P and the contact probe in which the Ni pipe does not contain P was remarkable as the evaluation temperature becomes higher. That is, in the contact probe in which the Ni pipe does not P (the content of P is less than the detection limit using the EDX), as the evaluation temperature becomes higher, the shrinkage sharply increased. In contrast, in the contact probe in which the Ni pipe contains P, an increase in shrinkage with a rise in evaluation temperature was smooth. In the contact probe of which the content of P is 8 wt %, the shrinkage could be 50 μm or less even at the evaluation temperature of 150° C. In the contact probe of which the content of P is 1.5 wt %, the shrinkage could be 50 μm or less even at the evaluation temperature of 160° C. In the contact probe of which the content of P is 2 wt % and 3 wt %, the shrinkage could be 50 μm or less even at the evaluation temperature of 220° C.

It is apparent from these results that the content of P in the Ni pipe may be 0.5 to 10 wt %, 0.5 to 7 wt %, 1 to 5 wt %, or 2 to 4 wt %, and thus, it is possible to improve the durability in the high temperature environment of the contact probe.

That is, according to the non-limiting embodiment of the present disclosure, the contact probe with improved durability is obtained by reducing the shrinkage after probing is performed even when the probing is performed in the high temperature environment.

Hereinafter, the non-limiting embodiment of the present disclosure has been described. The aforementioned non-limiting embodiment is merely the example for implementing various aspects of the present disclosure. Thus, the present disclosure is not limited to the aforementioned non-limiting embodiment, and can be performed by appropriately modifying the aforementioned non-limiting embodiment without departing from the gist of the present invention. For example, an outer shape of the contact probe can be a prism shape. The shape of the plunger can be a shape such as a prism, a cone, or a pyramid, in other examples.

The specific embodiments or examples described in the "DETAILED DESCRIPTION" are merely intended to clarify the technical content of the present disclosure, and the present disclosure should not be interpreted in a narrow sense by limiting to such specific examples.

REFERENCE SIGNS LIST 1, 2 contact probe
11, 13 Ni pipe
11a, 13a coiled spring structure
12 plunger
50 housing
60 hot plate

The invention claimed is:

1. A contact probe comprising:
   a nickel (Ni) pipe comprising a coiled spring structure, wherein the Ni pipe comprises 0.5 to 5 wt % of phosphorus (P).
2. The contact probe according to claim 1, wherein a content of the P in the Ni pipe is 1 to 5 wt %.
3. The contact probe according to claim 1, wherein a content of the P in the Ni pipe is 2 to 4 wt %.
4. The contact probe according to claim 1, further comprising:
   a plunger connected to the Ni pipe.
5. An electrical connection jig comprising the contact probe according to claim 1.
6. The contact probe according to claim 2, further comprising:
   a plunger connected to the Ni pipe.
7. An electrical connection jig comprising the contact probe according to claim 2.
8. An electrical connection jig comprising the contact probe according to claim 6.
9. The contact probe according to claim 3, further comprising:
   a plunger connected to the Ni pipe.
10. An electrical connection jig comprising the contact probe according to claim 3.
11. An electrical connection jig comprising the contact probe according to claim 9.
12. An electrical connection jig comprising the contact probe according to claim 4.
13. The contact probe according to claim 1, further comprising:
    a further coiled spring structure spaced apart from the coiled spring structure.
14. The contact probe according to claim 1, wherein the Ni pipe further comprises a gold layer on an inner periphery of the Ni pipe.
15. The contact probe according to claim 4, wherein the plunger is connected to the Ni pipe between the spring structure and an end of the Ni pipe.
16. A nickel (Ni) pipe comprising:
    a coiled spring structure, wherein the Ni pipe comprises 0.5 to 5 wt % of phosphorus (P).
17. The Ni pipe according to claim 16, wherein a content of the P in the Ni pipe is 1 to 5 wt %.
18. The Ni pipe according to claim 16, wherein a content of the P in the Ni pipe is 2 to 4 wt %.
19. The Ni pipe according to claim 16, further comprising:
    a gold layer on an inner periphery of the Ni pipe.
20. A method of forming a nickel (Ni) pipe, the method comprising:
    forming a Ni pipe structure using electrodeposition and a solution comprising phosphorus (P) so the Ni pipe structure comprises 0.5 to 5 wt % of P; and
    patterning the Ni pipe structure to form a coiled spring structure.

* * * * *